United States Patent [19]
Boitnott

[11] Patent Number: 5,314,846
[45] Date of Patent: May 24, 1994

[54] METHOD FOR PROCESSING A SEMICONDUCTOR WAFER

[75] Inventor: Charles Boitnott, Half Moon Bay, Calif.

[73] Assignee: Atomel Products Corporation, Sunnyvale, Calif.

[21] Appl. No.: 943,996

[22] Filed: Sep. 11, 1992

Related U.S. Application Data

[60] Continuation of Ser. No. 616,465, Nov. 21, 1990, abandoned, which is a division of Ser. No. 311,686, Feb. 15, 1989, Pat. No. 5,167,717.

[51] Int. Cl.⁵ .......................................... H01L 21/283
[52] U.S. Cl. ..................... 437/238; 437/235; 437/239; 148/DIG. 118
[58] Field of Search ................ 437/235, 238, 239; 118/719, 724, 725, 726, 733; 148/DIG. 118

[56] References Cited

U.S. PATENT DOCUMENTS

| | | | |
|---|---|---|---|
| 3,666,546 | 5/1972 | Reuter et al. | 437/239 |
| 4,018,184 | 4/1977 | Nagasawa et al. | 118/49.1 |
| 4,268,538 | 5/1981 | Toole et al. | 437/239 |
| 4,293,590 | 10/1981 | Takagi et al. | 437/239 |
| 4,315,479 | 2/1982 | Toole et al. | 118/715 |
| 4,351,805 | 9/1982 | Reisman et al. | 118/733 |
| 4,599,247 | 7/1986 | Bean et al. | 437/239 |
| 4,606,935 | 8/1986 | Blum | 437/239 |
| 4,634,331 | 1/1987 | Hertel | 118/724 |
| 4,920,918 | 5/1990 | Adams et al. | 118/724 |
| 5,167,717 | 12/1992 | Boitnott | 118/724 |

FOREIGN PATENT DOCUMENTS

0082731 5/1984 Japan .

Primary Examiner—Mary Wilczewski
Attorney, Agent, or Firm—Townsend and Townsend Khourie and Crew

[57] ABSTRACT

An apparatus and method for growing semiconductor quality oxide thermal layers on semiconductor wafers fast enough to be economically feasible as a single wafer process system. Process speed is insured by high pressure and high temperature. For example, if the pressure is about 100 atmospheres (1,500 psi) and at a temperature of 900° C., approximately 2.66 minutes are required to grow a 5,000Å oxide layer in a steam environment. The system can reach these operating conditions from ambient in approximately 30 seconds and depressurization and cool down require approximately 60 to 90 seconds. The apparatus includes a processing chamber to be pressurized with an oxidant, such as high pressure steam. The process chamber is contained in a pressure vessel adapted to be pressurized with an inert gas, such as nitrogen, to a high pressure. A pressure equalizing scheme is used to keep the fluid pressure of the process chamber and the pressure of the fluid pressure vessel substantially the same. The pressure equalization permits the use of thin walls for defining the process chamber.

9 Claims, 9 Drawing Sheets

METHOD FOR PROCESSING A SEMICONDUCTOR WAFER

This is a continuation of Ser. No. 07/616,465 filed Nov. 21, 1990 which was a Rule 60 continuation of Ser. No. 07/311,686 filed Feb. 15, 1989, now U.S. Pat. No. 5,167,717.

This invention relates to improvements in processing of semiconductor wafers, more particularly, to an apparatus and method for processing single semiconductor wafers at a relatively high rate.

BACKGROUND OF THE INVENTION

The use of steam to grow oxides on semiconductor wafers is well known and has been used extensively in the past. Typical temperatures of the steam are about 900° to 1,000° C. and pressures are about 10 to 25 atmospheres. At these operating conditions, a single wafer in a batch of wafers can be processed but at a relatively slow rate, such as 2 hours or more. It is often desirable to have a high throughput while providing for acceptable process conditions.

Due to industry trends, processing of wafers is being done in smaller batches and ultimately, processing will be done with single wafers. The reasons for this single wafer trend include greater control of the wafer, the high cost of the wafers, and the size of the wafers. It is much easier to control a single wafer during processing than it is to control a batch of wafers. Moreover, the cost of a wafer is relatively high and with greater wafer control, the possibility of wafer damage or breakage is minimized. Furthermore, the size of wafers is increasing. Typically, 6" wafers are now being used and it foreseeable that 8" and 10" wafers will be used in the future. Because of the foregoing problems, a need exists for improvements in the processing of semiconductor wafers as described above so that the processing can be economically feasible as a single wafer process system. The present invention satisfies this need.

Disclosures relating to the field of the present invention include U.S. Pat. Nos. 4,167,915, 4,268,538, 4,315,479 and 4,599,247.

SUMMARY OF THE INVENTION

The present invention is directed to an apparatus and method for growing semiconductor quality oxide thermal layers on semiconductor wafers fast enough to be economically feasible as a single wafer process system. All aspects of the apparatus and method of the present invention cooperate for achieving adequate process conditions while providing reasonable wafer throughput. Process speed is insured by high pressure and high temperature. For example, if the pressure is about 100 atmospheres (1,500 psi) and at a temperature of 900° C., approximately 2.66 minutes are required to grow a 5,000Å oxide layer in a steam environment. The system can reach these operating conditions from ambient in approximately 30 seconds and depressurization and cool down require approximately 60 to 90 seconds. Allowing 45 seconds for wafer handling and overhead, a wafer throughput of approximately 12 wafers per hour is achievable with the present invention at the above operating conditions.

The apparatus of the present invention comprises a unique processing chamber adapted to be pressurized with an oxidant, such as high pressure steam. The process chamber is contained in a pressure vessel adapted to be pressurized with an inert gas, such as nitrogen, to a high pressure.

Another unique feature of the present invention is the use of a pressure equalizing scheme which keeps the pressure of the process chamber and the pressure of the pressure vessel at substantially the same value. The pressure equalization permits the use of thin walls for defining the process chamber and allows the apparatus of the present invention to be highly flexible, capable of a wide range of operating conditions, such as from vacuum to high pressures, such as 100 atmospheres, and at temperatures ranging up to 900° C. and higher.

To obtain the required process rate and purity using the present invention, a semiconductor wafer is placed in the process chamber in the pressure vessel, following which the process chamber is pressurized with an oxidant, such as steam. Heaters outside the process chamber are used to heat the interior of the chamber. The steam is ramped at a certain rate, such as 50 psi per second. Since the walls of the chamber must be thin to minimize thermal cool down, preventing breakage of the walls due to fluid pressure differential requires a unique chamber-vessel separation scheme which includes the pressure equalization scheme. The process chamber is not physically sealed from the outer pressure vessel but rather is isolated from it by a dynamic steam generation and condensation arrangement which defines the pressure equalization scheme.

Steam is generated within a unique boiler at one end of the process chamber and within the pressure vessel. Steam flows through and out of the process chamber through an exhaust tube forming part of the pressure equalization scheme. Surrounding the steam exhaust tube is a water cooled condenser unit. This condenser unit condenses all the steam at a location remotely from the pressure vessel in which the process chamber and steam generator are located.

During the ramping pressure cycle, water is injected into the boiler at a rate to generate steam faster than that required to pressurize the process chamber. If the process chamber were actually sealed, the pressurization rate would be greater than that of the pressure vessel. In reality, the system is open so that excess steam flows through the condenser unit. As the pressure vessel is pressurized, the process chamber also pressurizes and the excess steam condenses in the condenser unit. The process chamber is filled with steam while the outer vessel is filled with nitrogen. If more water is used than is required, then more steam is condensed during operation, and if less water is used than is required, the nitrogen backfills to the steam exhaust, diluting the process steam. Once the process is complete, both the steam and nitrogen are exhausted through this condenser unit. No significant pressure across the process chamber walls is generated during this cycle so that no breakage is experienced.

The primary object of the present invention is to provide an improved apparatus of method for processing semiconductor wafers, wherein the process is highly flexible and suitable for applying oxides to single wafers at a high throughput while achieving optimum process conditions.

Other objects of this invention will become apparent as this investigation progresses, reference being had to the accompanying drawing for an illustration of an embodiment of the invention.

BRIEF DESCRIPTION OF THE DRAWINGS

FIG. 6 is a cross-sectional view taken along

DETAILED DESCRIPTION OF THE DRAWINGS

Apparatus for processing a semiconductor wafer in accordance with the present invention is broadly denoted by the numeral 10 and includes a pressure vessel 12 (FIGS. 1 and 3) for containing a hollow body 14 having a reaction or process chamber 16 therein for processing a semiconductor wafer 18. The apparatus operates to grow an oxide layer of semiconductor quality on a wafer in process chamber 16, the growth being fast enough to be economically feasible as a single wafer process system. All elements of apparatus 10 have been designed for achieving both adequate processing conditions and reasonable throughput.

Figure 3:
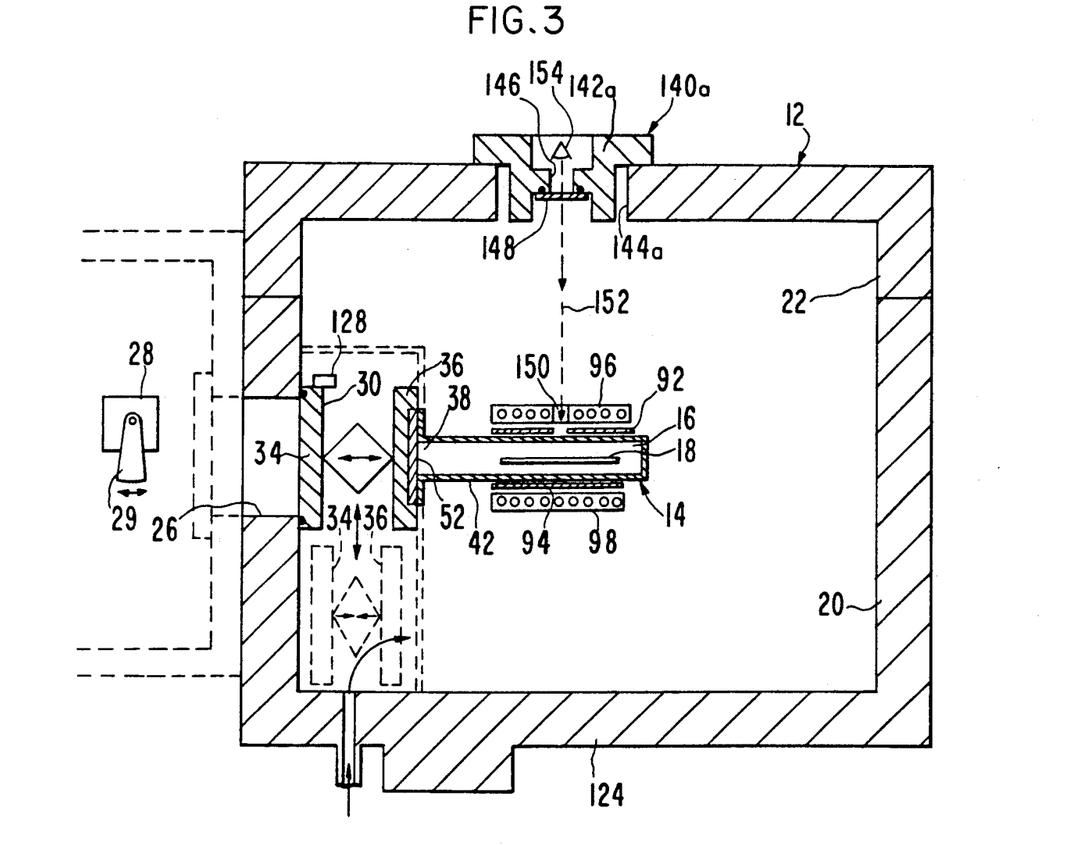
FIG. 3 is a schematic view of the apparatus, showing the body having the reaction chamber within a pressure vessel and closure means for closing the pressure vessel and the body during the process.

Pressure vessel 12 is shown schematically in detail in FIG. 3 and includes a box-like housing which is coupled to a source 13 (FIG. 1) of an inert gas, such as nitrogen, the housing having a lower part 20 and an upper part 22, the upper part 22 forming a lid for the open top of lower part 20. The dimensions of the parts 20 and 22 of pressure vessel 12 are chosen so that the interior space 24 of the pressure vessel can withstand fluid pressures of over 100 atmospheres (above 1,500 psr). Typically, the lower part 20 of pressure vessel is formed of stainless steel and the upper part 22 is formed of aluminum. However, any combination of materials can be used.

The upper part 20 is pivotally mounted on the lower part 22 for rotation about a generally vertical axis (not shown) so that the upper part 22 can easily pivot into and out of a position closing the open top of lower part 20. Thus, access to space 24 can be had when the open top of lower part 20 is open.

The pressure vessel 12 has a wafer access opening 26 (FIG. 3) in the side wall of the lower part 20. The access opening 26 is adjacent to a wafer transfer mechanism 28 of conventional design externally of pressure vessel 12. Transfer mechanism 28 has a pivotal plate 29 adapted to insert a wafer into pressure vessel 12 and into body 14 having reaction chamber 16. Mechanism 28 is also adapted to remove a wafer 18 from reaction chamber 16 and from pressure vessel 12 after the wafer has been processed in the reaction chamber.

The wafer is moved into and out of the reaction chamber when a closure mechanism 30 is in the dashed line position of FIG. 3. Mechanism 30 is movable under the influence of a power device 32 (FIG. 11) to move a pair of closure members 34 and 36 (FIG. 3) into closing relationship to access opening 26 of pressure vessel 12 and of access opening 38 (FIGS. 2A and 3) at the entrance end of body 14 having process chamber 16 therein. Power device 32 will be described hereinafter in more detail.

Figures 2, 2A, 2B:
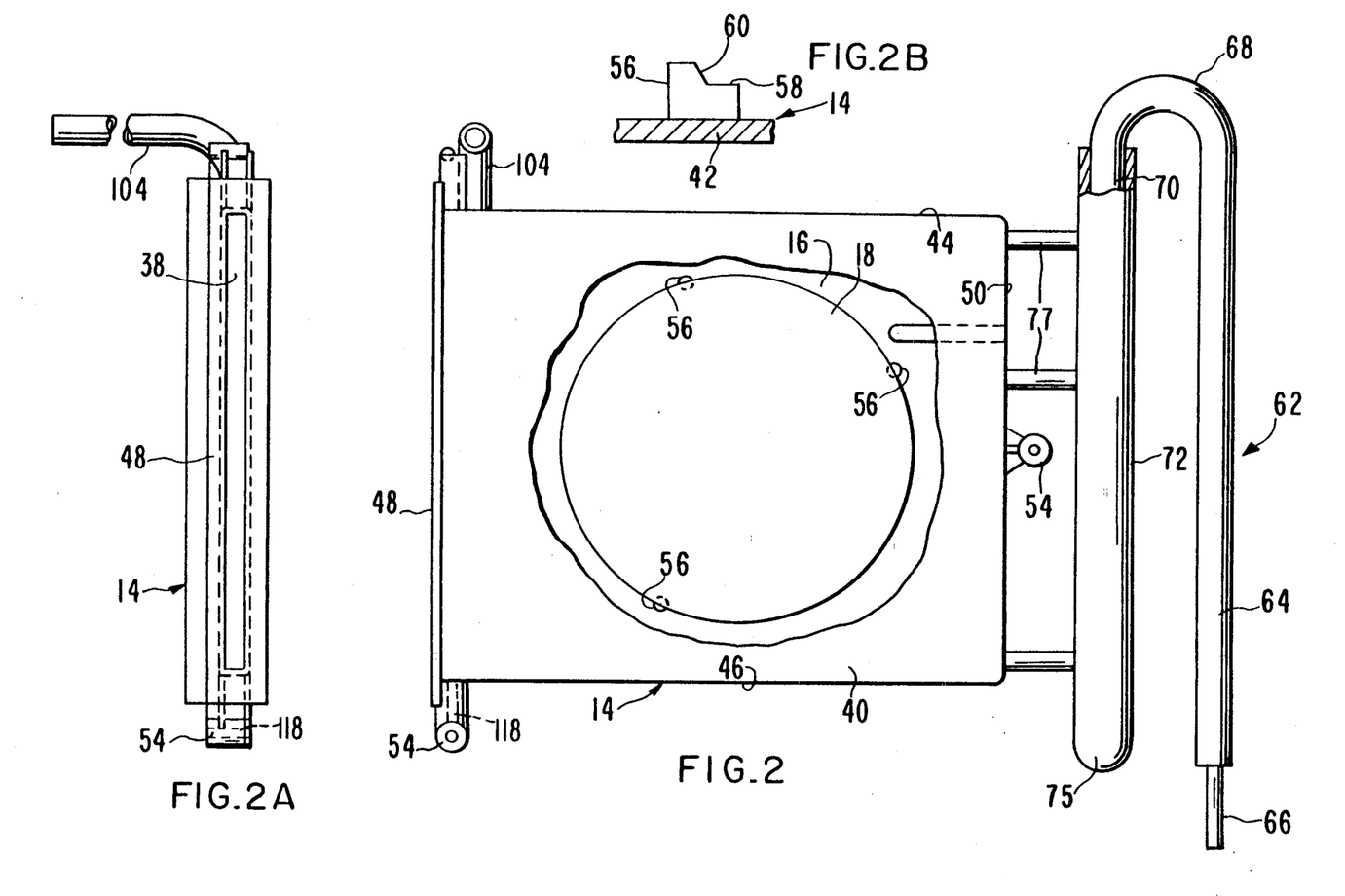
FIG. 2 is a top plan view of a body defining a process or reaction chamber for receiving a single semiconductor wafer to be processed, showing the steam generator attached to the body to form an integral unit therewith.
FIG. 2A is an end elevational view of the body of FIG. 2.
FIG. 2B is an enlarged, side elevational view of a pin for supporting the wafer in the body of FIG. 2.

Body 14 is generally rectangular in shape as shown in FIG. 2. It is comprised of thin walls (2 mm thick), including upper and lower walls 40 and 42, a pair of side walls 44 and 46 and a pair of end walls 48 and 50. The walls of body 14 are formed of a high purity material, such as quartz, and the end wall has opening 38 therein as shown in FIG. 3. Wall 48 further includes an outer peripheral flange which mates with a quartz element 52 (FIG. 3) carried by closure member 36. When the closure member 36 is in the full line position of FIG. 3, quartz element 52 closes opening 38, thereby blocking access to the reaction chamber 16 of body 14. Conversely, when closure member 36 is in the dashed line position of FIG. 3, element 52 will be out of closing relationship to opening 38 and a wafer 18 can be moved into or out of reaction chamber 16 by the action of mechanism 28.

Body 14 having reaction chamber 16 therein can be mounted in any suitable manner within the lower part 20 of pressure vessel 12. For instance, quartz sleeves 54 (FIG. 5A) can be integral with body 14 at a number of spaced locations, respectively, and each sleeve can receive a rod (not shown) coupled to the inner surface of lower part 20 of pressure vessel 12 in any suitable manner so that body 14 will be effectively supported from beneath so that the entrance opening 38 is horizontally and vertically aligned with the access opening 26 in lower part 20 of pressure vessel 12.

Lower wall 42 of body 14 is provided with 3 spaced pegs or pins 56 on its upper surface as shown in FIGS. 2 and 2B for supporting a wafer 18 in a horizontal position within process chamber 16. The cross section of each pin 56 is shown in FIG. 2B in which a horizontal surface 58 is adjacent to an inclined surface 60, the inclined surface being provided to allow the wafer to be centered on horizontal surface 58 in the event that mechanism 28 does not properly seat the wafer on surface 58. Mechanism 28 typically will include plate 29 which lifts a wafer 18 out of a cassette of conventional construction and moves the wafer into and through opening 26 and opening 38 and onto pins 56, whereupon the plate will be lowered slightly and then retracted out of openings 26 and 38, leaving the wafer on surfaces 58 of pins 56 for processing.

A steam generator 62 of high purity material, such as quartz, is coupled with body 14 at side wall 50 of the latter as shown in FIG. 2. Steam generator 62 includes a first tube 64 having an inlet end 66 for receiving deionized water from a source 67 (FIG. 1) of such water. Tube 64 is connected to a U-shaped end portion 68 which in turn is coupled to a second tube 70 within a larger tube 72. Tubes 70 and 72 are closed at adjacent ends 74 and 75 (FIG. 6) thereof and tube 70 has holes 76 (FIG. 7) at the upper extremity thereof, placing tube 70 in fluid communication with tube 72. Side tubes 77 coupled to tube 72 extend to end wall 50 (FIG. 2) of body 14, thereby placing tube 72 in fluid communication with process chamber 16.

Figure 6:
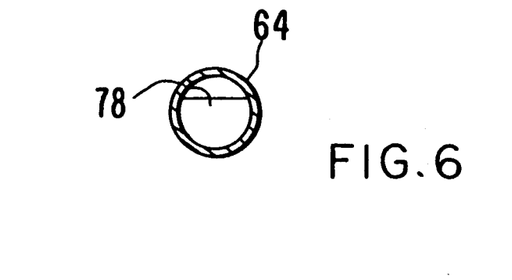

Tube 64 is provided with a series of spaced baffles 78 extending into the tube from the inner periphery thereof. Each baffle 78 has the shape as shown in FIG. 6 and the baffles 78 are staggered so as to form a serpentine path for deionized water and vapor for flow through the tube 64 to tube 70.

Figure 7:
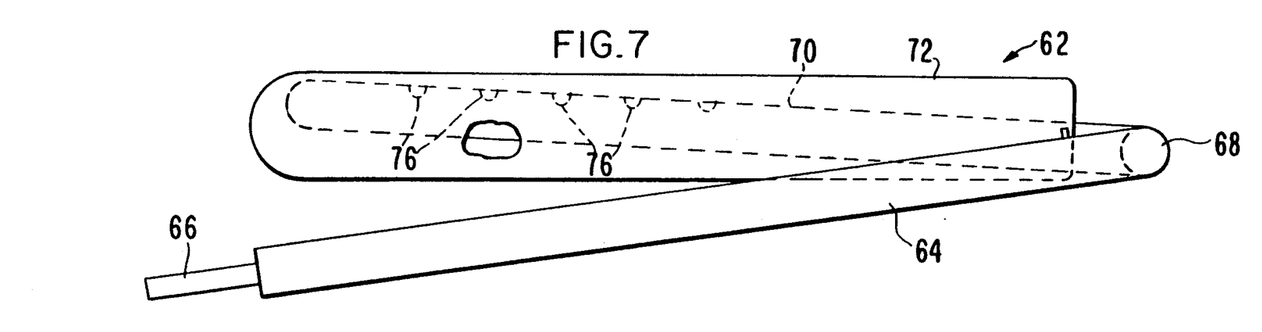
FIG. 7 is a side elevational view of the steam generator of FIGS. 4 and 5.

Holes 76 are in tube 70 to allow vapor to rise in tube 70 and enter tube 72, but the holes are placed so that water cannot enter tube 72 from tube 70, thereby assuring that only vapor will pass upwardly and into tube 72 and thereby into reaction chamber 16. If water were to enter reaction chamber 16, it would impair the action of the process in reaction chamber 16. Also, tube 64 is inclined as shown in FIG. 7 relative to horizontal attitude of tube 72 so that water will tend to flow downhill in the event that water tends to flow through tube 64.

Figure 4:
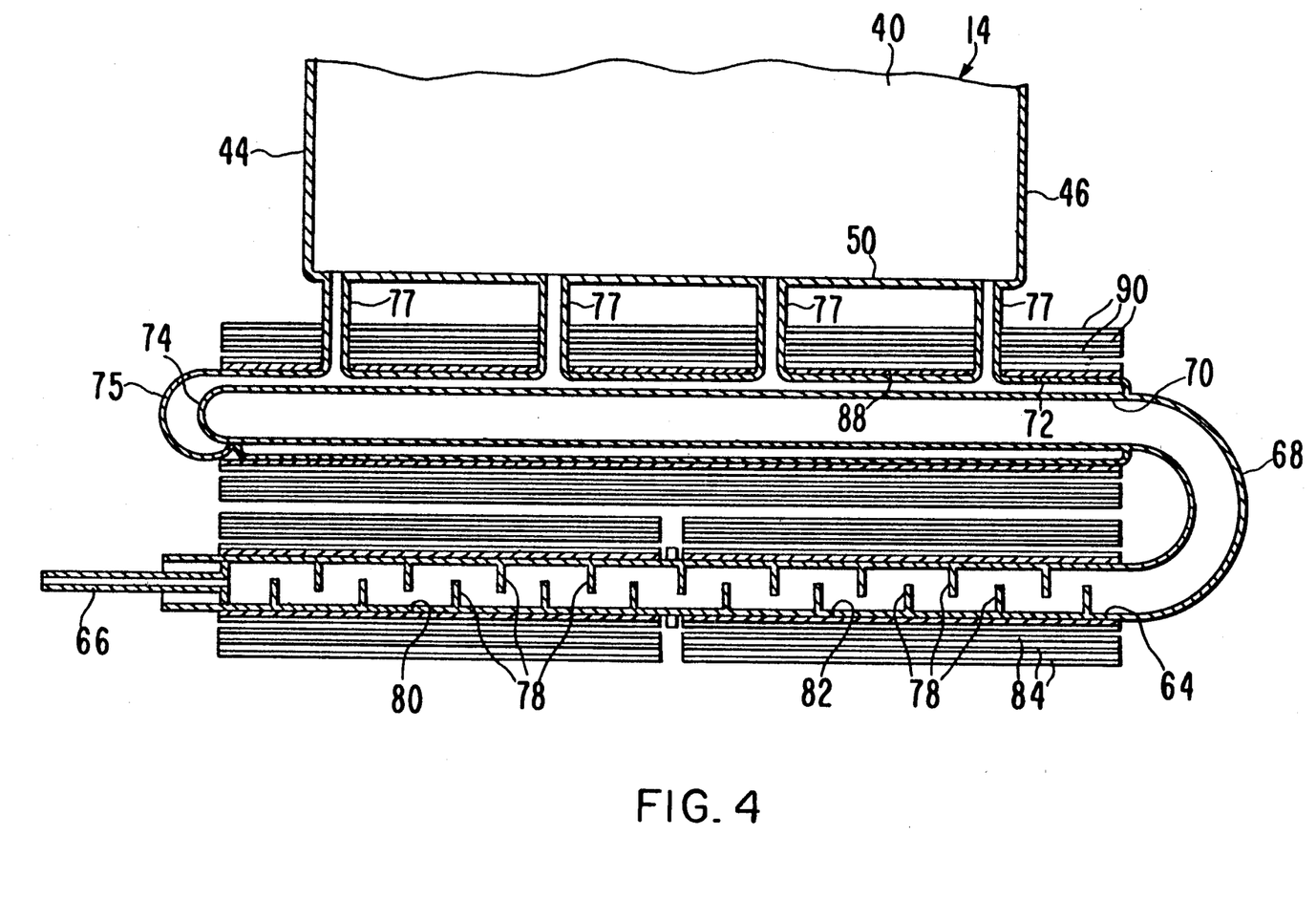
FIG. 4 is an enlarged, fragmentary top plan view of the body, showing the steam generator associated therewith.

A pair of cylindrical, electrical resistance heaters 80 and 82 surround two parts of tube 64 as shown in FIG. 4. Heaters 80 and 82 are of a high purity material, such as graphite, and the heaters are coupled to some suitable source of electrical power so that heat energy will be radiated into and conducted through tube 64 for heating the deionized water to a vapor flowing therethrough.

Each of heaters 80 and 82 has a series of spaced, quartz shells 84 (FIG. 4) concentric to and surrounding tube 64. Shells 84 are coated on their outer surfaces with aluminum oxide to reduce heat losses. The shells thus serve to reflect the heat energy back into tube 64 instead of outwardly into the ambient atmosphere. Thus, shells 84 render the heaters 80 and 82 more efficient.

A cylindrical heater 88 (FIG. 4) surrounds tube 70 for heating further the water vapor therein to a high temperature, such as 900° C. Heater 88 extends throughout a major portion of the length of tube 72 and is provided with a plurality of spaced, coated, quartz shells 90 concentrically surrounding tube 72 for the same purpose as shells 84.

Figure 8:
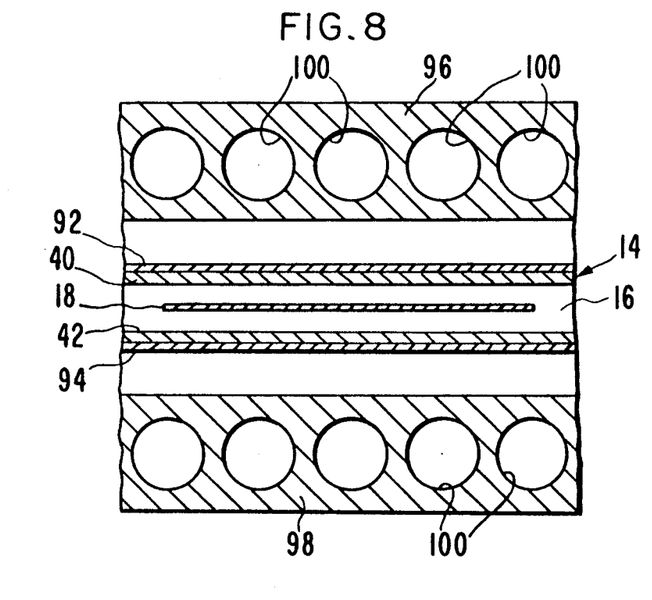
FIG. 8 is an enlarged, fragmentary view of the body having the process chamber showing the relative positions of the wafer to be processed, the chamber itself and chill plates above and below the wafer.

Electrical resistance heaters 92 and 94 are mounted on body 14 as shown in FIG. 8, heater 92 being above and in proximity to top wall 40 and heater 94 being below and in proximity to bottom wall 42 of body 14. Heaters 92 and 94 are flat, planar heaters and heat the wafer 18 and steam within process chamber 16 of body 14.

Chill plates 96 and 98 are mounted in some suitable manner within pressure vessel 12. Chill plates 96 and 98 have coolant passages 100 therethrough to allow coolant to pass therethrough for chilling the wafer before, during and after the processing of the wafer. A suitable source 103 (FIG. 1) of coolant is provided in apparatus 10 to supply coolant to chill plates 96 and 98.

Figure 1:
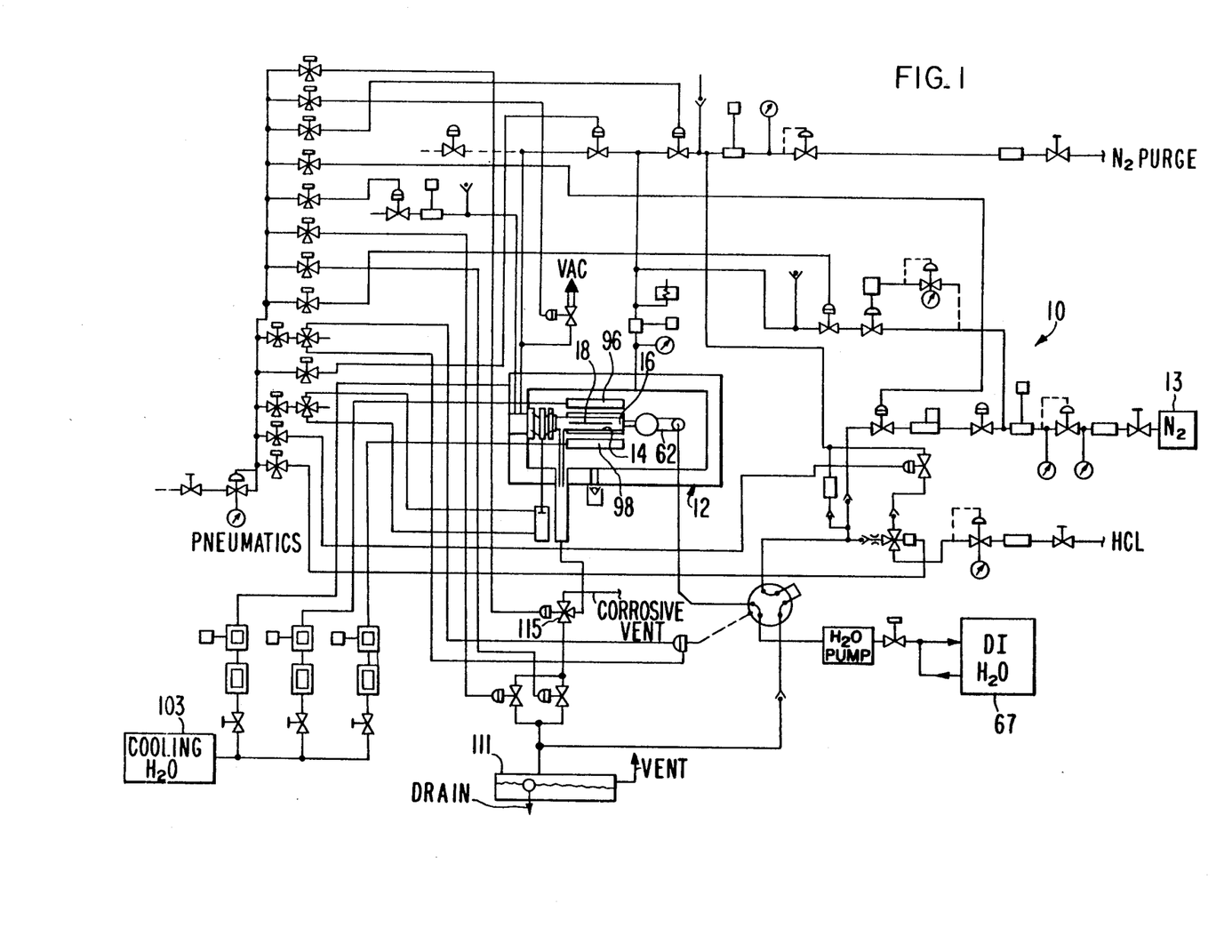
FIG. 1 is a schematic view of the apparatus of the present invention for processing single semiconductor wafers at a high pressure and temperature.
Figures 9, 10:
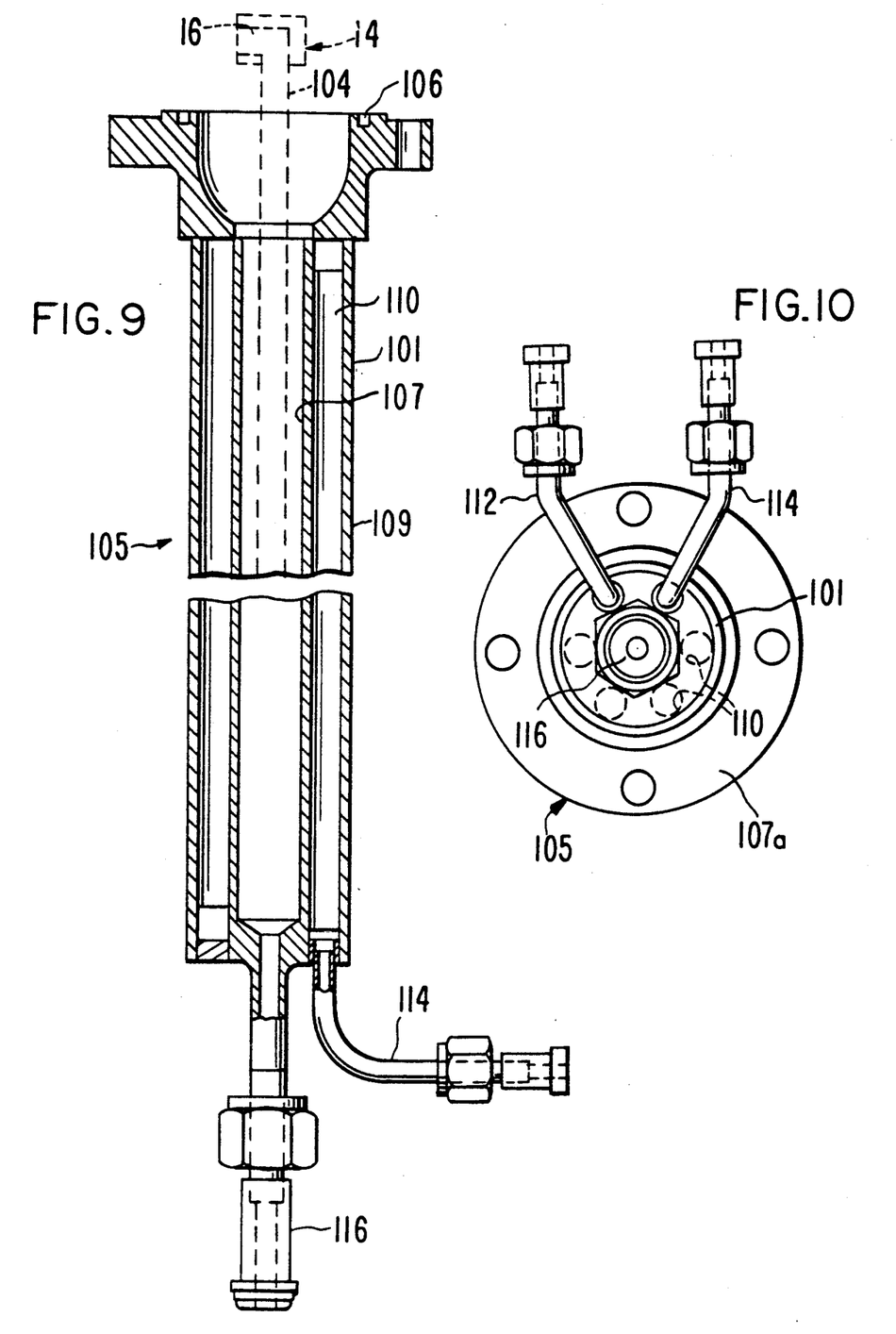
FIG. 9 is a vertical section of the discharge tube for directing steam and nitrogen out of the process or reaction chamber and the pressure vessel.
FIG. 10 is a bottom plan view of the structure of FIG. 9.

A discharge tube 104 (FIG. 2A, 5A and 5B) is coupled to body 14 and extends outwardly and downwardly therefrom. Tube 104 is of quartz and extends partially through condenser unit 105 (FIG. 9) which includes a flange 107a on open end 106 adapted to be secured to and extend downwardly from pressure vessel 12. Condenser 105 has a central passage 107 therethrough surrounded by wall 109 having a coolant passage 110 therein. Coolant is supplied from coolant source 103 to a pair of tubes 112 and 114 (FIG. 10). Central passage 107 is coupled by a tube 116 to a valve 115 (FIG. 1) for venting the tube 104 and passage 107 to a reservoir 111 (FIG. 1).

Tube 104 as shown in FIG. 2 has a thermocouple 118 near its lower end which is used to sense the temperature of the steam exiting or tending to exit through the tube 104 from chamber 16. In this way, the pressure of the nitrogen in pressure vessel 12 and the pressure of the steam in reaction chamber 16 can be equilibrated at all times so that there will be a balance of the two pressures so that the two pressures will be substantially equal at all times. If the pressure of the steam is too high, the steam will tend to flow out of tube 104 and be condensed on wall 109. If the pressure of the nitrogen is too great, it will tend to flow into tube 104 and into process chamber 16 which is clearly undesirable. By monitoring these two pressures by sensing the temperature of the steam exhaust, equalizing the pressures can be achieved.

In reality, the system is open. As the outer vessel 12 is pressurized, the process chamber 16 is also pressurized and the excess steam is condensed on the condenser wall. The process chamber 16 is entirely filled with steam while the outer pressure vessel 12 is filled entirely with nitrogen. If more water is used than is required, then more steam is condensed during operation and if less water is used than is required, nitrogen flow through the steam exhaust tube 104 diluting the steam.

Figure 11:
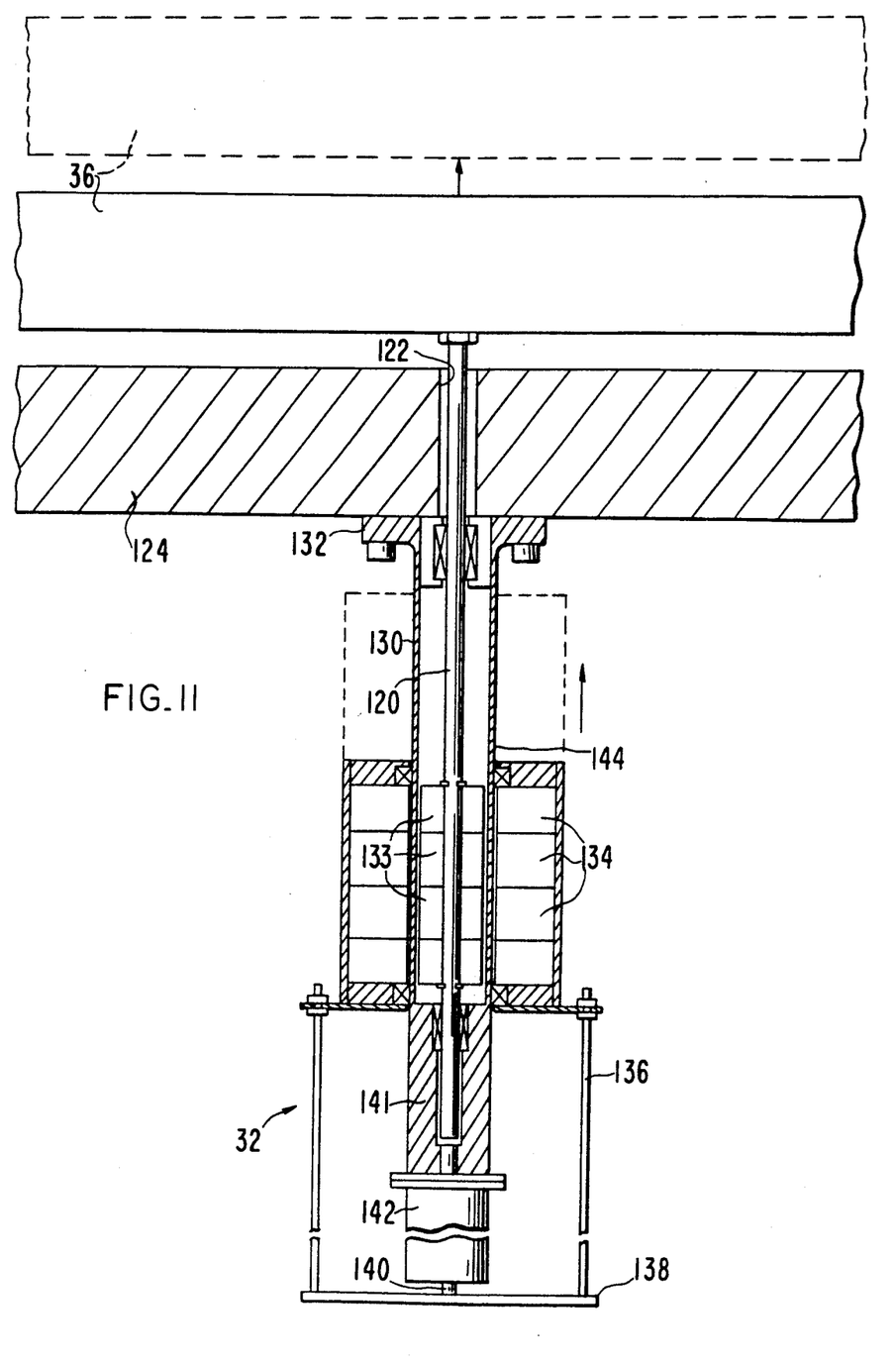
FIG. 11 is an enlarged, fragmentary, sectional view of an actuator for manipulating the closures for the pressure vessel and the body having the reaction chamber.

Power device 32 (FIG. 11) is coupled to closure members 34 and 36 by way of a rod 120 which extends through a hole 122 in the bottom 124 of pressure vessel 12 as shown in FIGS. 3 and 11. Rod 120 is coupled to closure members 34 and 36 to raise the closure members from the dashed line positions of FIG. 3 to the full line positions of FIG. 3 when rod 120 moves upwardly relative to bottom wall 124 of pressure vessel 12.

Closure members 34 and 36 move upwardly until at least one of the members, such as member 34, strikes a stop 128 (FIG. 3), following which the vertical movement of closure members 34 and 36 stops while lateral movement takes over due to a pivotal linkage (not shown), moving the closure members 34 and 36 into closing relationship to access openings 26 and 38, respectively. The closure members are spring-biased toward each other so that when the pressure of the rod 120 is relaxed, closure members 34 and 36 move inwardly toward each other and open access openings 26 and 38, respectively.

Rod 120 is mounted within a tube 130 coupled by a flange 132 to the bottom surface of bottom wall 124 of pressure vessel 12 (FIG. 11). Rod 120 carries a number of stacked magnets 133 thereon which are magnetically coupled to other permanent magnets 134 surrounding tube 130. Magnets 134 are coupled to a frame 136 having a lower plate 138 coupled to piston rod 140 of an air cylinder 142. Cylinder 142 is coupled to the lower end of tube 141, the latter being stationarily mounted on a rigid support 144, such as a support coupled to the bottom wall 124 of pressure vessel 12.

As cylinder 142 is actuated, piston rod 140 is elevated to raise magnets 134. As magnets 134 move upwardly, magnets 132 also move upwardly because of the magnetic coupling between the magnets. This causes rod 120 to move upwardly to cause the closure members 34 and 36 to raise to the full line positions of FIG. 3 or until closure member 34 engages stop 128. Then, the closure members 34 and 36 move laterally and into closing relationship with respective access openings 26 and 38. A suitable pivotal linkage causes the lateral movement of closure members 34 and 36 as is well known.

As soon as piston rod 140 is allowed to lower, rod 120 moves downwardly, causing closure members 34 and 36 to move toward each other and then downwardly into the dashed line positions of FIG. 3. The power device of FIG. 11 can thus be implemented without the need for elaborate seals.

An end-of-process window 140a is provided in pressure vessel 12 as shown in FIG. 3. Window 140a is part of upper part 22 of the pressure vessel 12 and includes a window insert 142a which can be circular and adapted to be inserted into an opening 144a in the top portion of vessel part 22. Insert 142a has a hole 146 formed therein and covered with a transparent glass pane 148 to form a window aligned with a hole 150 in the next adjacent chill plate 96. A laser beam 152 can be coupled to a laser source 154 carried by window 140a for directing the laser beam onto wafer 18 in process chamber 16 to determine the characteristics of the oxide on the wafer 18 by interference techniques. Insert 142a has an annular flange in sealing relationship to the outer surface of top part 22 of vessel 12 to close the interior of pressure vessel 12 from the atmosphere.

In operation, nitrogen is supplied from source 13 (FIG. 1) to the interior of pressure vessel 12 and steam is supplied to the interior of body 14 having reaction chamber 16 therein. These gases are directed into respective chambers after a wafer 18 has been placed within reaction chamber 16.

Process speed is ensured by high pressure; for example, 100 atmospheres (1,500 psi) and high temperature; for example, 900° C. At these operating conditions, the time to grow an oxide layer of 500Å thick in a steam environment is about 2.667 minutes. A system of the present invention can reach these conditions from ambient in approximately 30 seconds. Depressurization and cool down requires 60 to 90 seconds with the possibility of 30 seconds. Allowing 45 seconds for wafer handling and overhead, a throughput of approximately 12 wafers per hour is achievable with apparatus 10.

To obtain the required process rate and purity, a wafer 18 is placed in process reaction chamber 16 and filled with steam. All heaters are outside chamber 16 which is contained within pressure vessel 12 having nitrogen therein. This arrangement of the quartz body 14 filled with steam inside a pressure vessel 12 filled with nitrogen is ramped at nearly 50 psi per second to meet the operational requirements. Since the quartz body 14 must be thin, such as 2 mm thick (to minimize thermal cool down), preventing breakage requires a unique chamber separation scheme.

The inner chamber 16 is not physically sealed from the outer pressure vessel but rather isolated by condensation unit 105 (FIG. 9). Steam is generated by a steam generator 62 (FIG. 1) at one end of body 12, and steam flows through chamber 16 and out through tube 104. Surrounding tube 104 is condenser unit 105 to form a trap which condenses all the steam remotely from the pressure vessel 12 in which the chamber 16 and steam generator 62 are located.

During the ramping pressure cycle, water is injected into the steam generator at a rate that generates steam faster than that required to pressurize the process chamber 16. If chamber 16 were actually sealed, the pressurization rate would be greater than that of the surrounding pressure vessel 12. The system is open so that exit steam flows through condenser unit 105 as the outer vessel 12 pressurizes.

Once the process is complete, both the steam and nitrogen are exhausted to the atmosphere through the steam condenser unit 105. No significant pressure differential across the quartz walls of body 14 is generated during the cycle so that no breakage is experienced.

Figure 5:
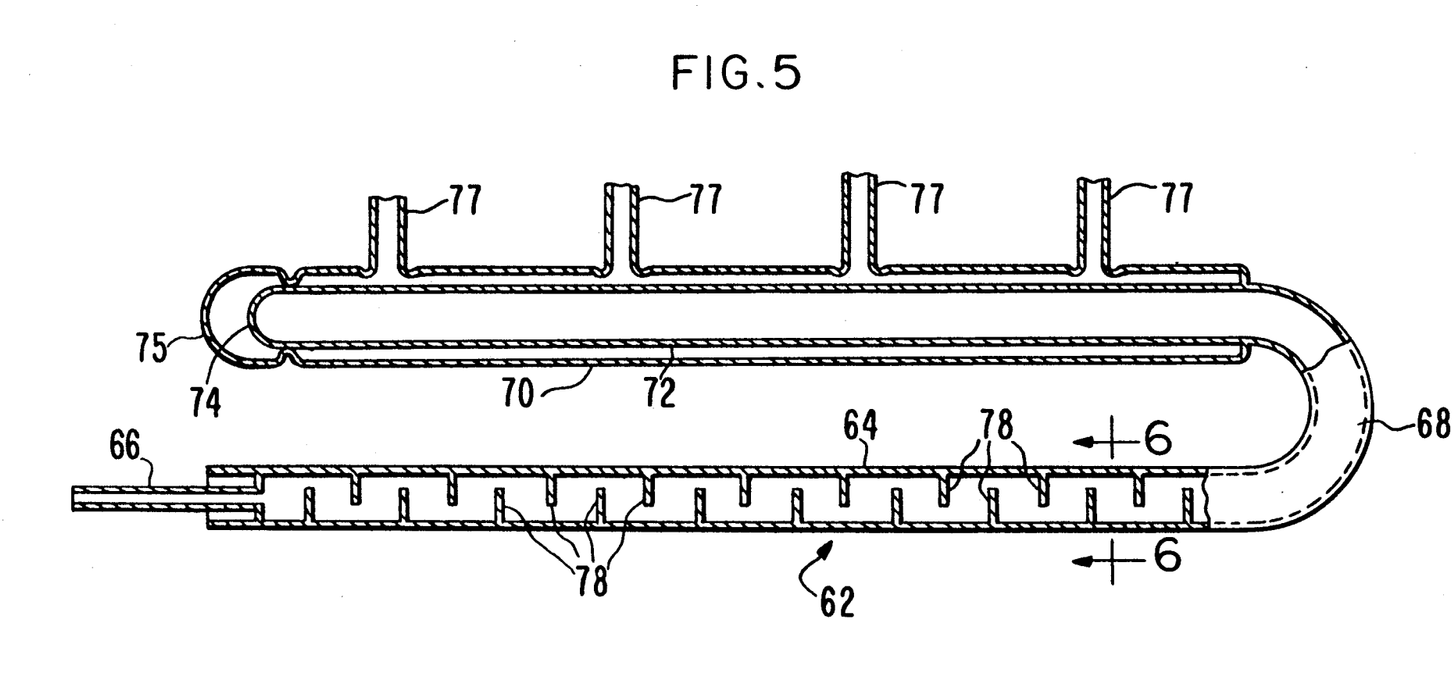
FIG. 5 is a view similar to FIG. 4 but showing the steam generator without the heaters and heat reflectors.
Figure 5A:
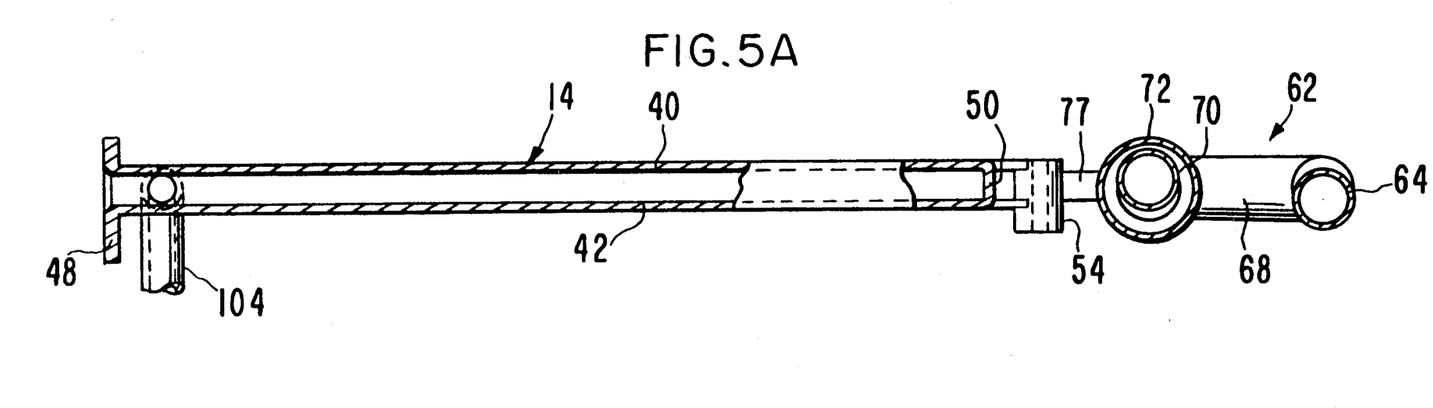
FIGS. 5A and 5B are vertical sectional views through the body of FIG. 2.
Figure 5B:
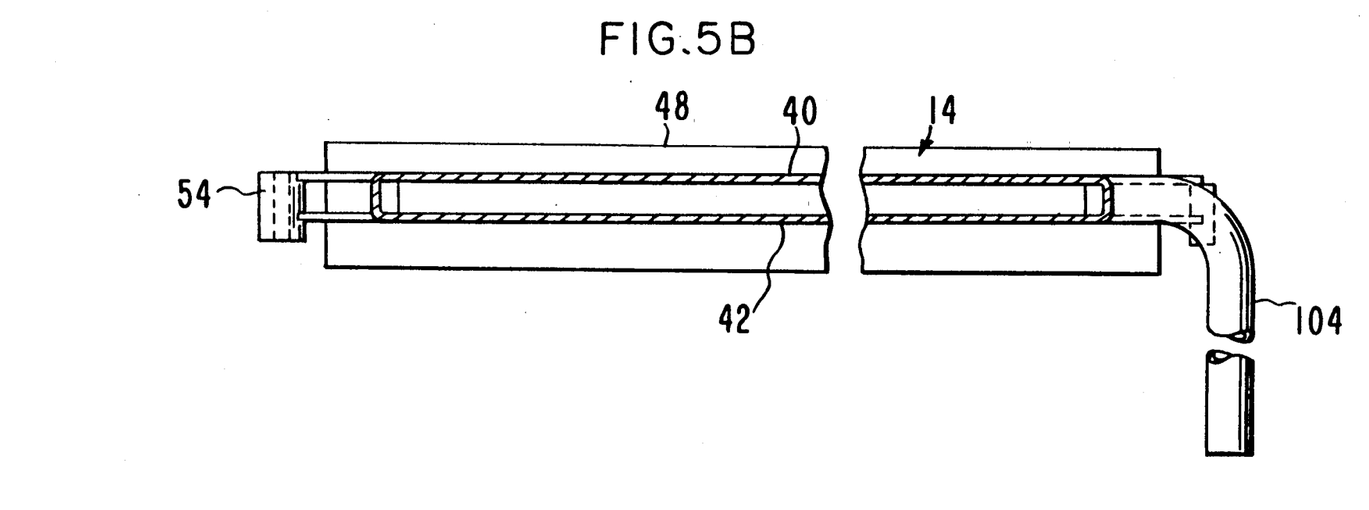

The steam generator 62 has a unique baffle design in which the baffles 78 are also made of quartz as is the tube 64 which carries the baffles (FIG. 5 and 6). The baffles reduce the blowing water as the water is being turned into steam. The entire steam generator is of high purity material, such as quartz to prevent contamination of the interior of process chamber 16 and thereby avoid contamination of a wafer 18 in the process chamber. The manifold provided by tubes 70 and 72 of steam generator 62 cooperate with the holes 76 in tube 70 to prevent all water drops from entering process chamber 16.

The boiler heaters 80, 82 and 88 (FIG. 4) are of high purity material, such as graphite, and provide for minimal metal contamination of the quartz material of the steam generator 62. The segmented heaters 80 and 82 and the single manifold heater 88 distribute heat energy as needed for the generation of steam in steam generator 62. There is no need to insulate the heaters, thereby eliminating a principal source of wafer contamination.

The process chamber heaters 92 and 94 are unique in heating chamber 16 in that the entire chambers area is heated at a specific operating temperature. There is rapid heat up due to high power heaters 92 and 94. There is also rapid cool down due to the close proximity of the chill plates 96 and 98 and the small thermal mass of body 14. Heaters 92 and 94 are of high purity graphite so as to provide for no metallic contamination of the interior of pressure vessel 12 or body 14. There are no fibrous insulators so as to provide for less contamination and reduced particles. The design of body 14 is suitable for broad pressure ratings including a vacuum through 100 atmospheres.

I claim:
1. A method for processing a semiconductor wafer comprising:
   providing a first space surrounding a second space with the spaces having respective first and second tubular exhaust zones in fluid communication with each other, said first exhaust zone surrounding the second exhaust zone;
   inserting a semiconductor wafer in the second space;
   closing the spaces to the atmosphere;
   filling the first space with an inert gas under pressure;
   filling the second space with an oxidant under pressure from a source outside of the second space;
   heating the oxidant to a processing temperature;
   cooling the wafer in the second space after the wafer has been processed; and
   substantially equilibrating the pressures in the first and second spaces, said equilibrating step including sensing the temperature of the oxidant at the outer end of the second exhaust zone.

2. A method as set forth in claim 1, wherein the fluid pressure of the first and second spaces during processing of the wafer is in the range of a vacuum to 120 atmospheres.

3. A method as set forth in claim 1, wherein the fluid pressure in said spaces is approximately 100 atmospheres.

4. A method as set forth in claim 1, wherein the processing temperature is in the range of 0° C. to 1100° C.

5. A method as set forth in claim 1, wherein the processing temperature is in the range of 800° C. to 1000° C.

6. A method as set forth in claim 1, wherein the processing temperature is approximately 900° C. and the fluid pressure in the spaces is approximately 100 atmospheres.

7. A method as set forth in claim 1, wherein the step of filling the second space with an oxidant includes generating steam in a region within the second space and externally of the first space.

8. A method as set forth in claim 1, wherein is included the step of preventing water from entering the second space as the steam is being generated.

9. A method as set forth in claim 1, wherein said equilibrating step includes preventing the oxidant from entering the first space and preventing the inert gas from entering the second space, whereby the pressure of one space substantially balances the pressure in the other space.

* * * * *